(12) United States Patent
Cha et al.

(10) Patent No.: US 9,786,694 B2
(45) Date of Patent: Oct. 10, 2017

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventors: Gwang Min Cha, Hwaseong-si (KR); Su Kyoung Yang, Yongin-si (KR); Chan Woo Yang, Siheung-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/264,490

(22) Filed: Sep. 13, 2016

(65) Prior Publication Data

US 2017/0117298 A1    Apr. 27, 2017

(30) Foreign Application Priority Data

Oct. 23, 2015    (KR) ........................ 10-2015-0148083

(51) Int. Cl.
| | |
|---|---|
| *H01L 27/12* | (2006.01) |
| *H01L 23/52* | (2006.01) |
| *H01L 23/532* | (2006.01) |
| *H01L 29/24* | (2006.01) |
| *H01L 29/786* | (2006.01) |
| *H01L 29/66* | (2006.01) |
| *H01L 29/423* | (2006.01) |
| *H01L 21/4763* | (2006.01) |
| *H01L 21/02* | (2006.01) |
| *H01L 29/45* | (2006.01) |

(52) U.S. Cl.
CPC ........ *H01L 27/124* (2013.01); *H01L 21/0206* (2013.01); *H01L 21/02175* (2013.01); *H01L 21/02244* (2013.01); *H01L 21/47635* (2013.01); *H01L 23/53223* (2013.01); *H01L 23/53238* (2013.01); *H01L 23/53252* (2013.01); *H01L 23/53266* (2013.01); *H01L 27/1225* (2013.01); *H01L 27/1259* (2013.01); *H01L 29/24* (2013.01); *H01L 29/42356* (2013.01); *H01L 29/45* (2013.01); *H01L 29/66969* (2013.01); *H01L 29/7869* (2013.01)

(58) Field of Classification Search
CPC combination set(s) only.
See application file for complete search history.

(56) References Cited

U.S. PATENT DOCUMENTS

| | | | |
|---|---|---|---|
| 5,500,380 A | 3/1996 | Kim | |
| 2007/0170434 A1* | 7/2007 | Inoue | ..................... C04B 35/01 257/72 |

(Continued)

FOREIGN PATENT DOCUMENTS

| | | |
|---|---|---|
| KR | 10-0879038 B1 | 1/2009 |
| KR | 10-2012-0050177 A | 5/2012 |

*Primary Examiner* — Mamadou Diallo
(74) *Attorney, Agent, or Firm* — Innovation Counsel LLP

(57) ABSTRACT

A display device and a method of manufacturing the display device are provided. According to an exemplary embodiment, a display device includes: a substrate; a gate electrode disposed on the substrate; a semiconductor pattern disposed on the gate electrode; data wiring disposed on the semiconductor pattern and having a data line, a source electrode, and a drain electrode; a first barrier layer disposed between the data wiring and the semiconductor pattern; and undercuts disposed on at least one side of each segment of the first barrier layer.

19 Claims, 18 Drawing Sheets

(56) References Cited

U.S. PATENT DOCUMENTS

| | | | |
|---|---|---|---|
| 2013/0107155 A1* | 5/2013 | Guo | G02F 1/1368 349/43 |
| 2014/0001469 A1* | 1/2014 | Park | H01L 29/78693 257/43 |
| 2015/0171111 A1* | 6/2015 | Hong | H01L 29/66969 257/43 |
| 2016/0020103 A1* | 1/2016 | Liu | H01L 29/45 257/72 |
| 2016/0062162 A1* | 3/2016 | Kang | G02F 1/1368 257/72 |

\* cited by examiner

DISPLAY DEVICE AND MANUFACTURING METHOD THEREOF

This application claims priority to Korean Patent Application No. 10-2015-0148083 filed on Oct. 23, 2015 in the Korean Intellectual Property Office, the disclosure of which is incorporated herein by reference in its entirety.

BACKGROUND

1. Field

The present disclosure relates to a display device and a manufacturing method thereof.

2. Description of the Related Art

The importance of display devices has steadily grown with recent developments in multimedia technology. As a result, a variety of display devices such as a liquid crystal display (LCD), an organic light-emitting diode (OLED), and the like have been developed and widespread.

A liquid crystal display (LCD), which is one of the most widely-used flat panel displays, includes two substrates on which field-generating electrodes such as pixel electrodes and a common electrode are formed and a liquid crystal layer that is interposed between the two substrates. The LCD generates an electric field in the liquid crystal layer by applying a voltage to the field-generating electrodes, and thus displays an image by determining the orientation of liquid crystal molecules in the liquid crystal layer and controlling the polarization of incident light.

In the meantime, as the resolution of LCDs has increased, large-size substrates formed of, for example, glass, and thin-film transistors TFTs with excellent performance are increasingly needed.

SUMMARY

Exemplary embodiments of the present disclosure provide a display device including thin-film transistors (TFTs) having semiconductor with a uniform thickness.

Exemplary embodiments of the present disclosure also provide a display device capable of preventing contamination of the top of semiconductor patterns.

Exemplary embodiments of the present disclosure also provide a manufacturing method of a display device including TFTs having semiconductor patterns with a uniform thickness.

However, exemplary embodiments of the present disclosure are not restricted to the exemplary embodiments set forth herein. The above and other exemplary embodiments of the present disclosure will become more apparent to one of ordinary skill in the art to which the present disclosure pertains by referencing the detailed description of the present disclosure given below.

According to an exemplary embodiment, a display device includes: a substrate; a gate electrode disposed on the substrate; a semiconductor pattern disposed on the gate electrode; data wiring disposed on the semiconductor pattern and having a data line, a source electrode, and a drain electrode; a first barrier layer disposed between the data wiring and the semiconductor pattern; and undercuts disposed on at least one side of each segment of the first barrier layer.

The first barrier layer may include molybdenum oxide areas that contain molybdenum oxide, and molybdenum (Mo) areas that contain Mo, but no molybdenum oxide.

The molybdenum oxide areas may be provided on outer sides of each segment of the first barrier layer, and the Mo areas may be respectively provided inside the molybdenum oxide areas.

The undercuts may be disposed in the molybdenum oxide areas.

Sidewalls of each segment of the first barrier layer where the undercuts are formed may be tapered or reversely tapered.

A concentration of molybdenum oxide in each of the molybdenum oxide areas may gradually decrease from an outer side to an inner side of a corresponding molybdenum oxide area.

The semiconductor pattern may contain Mo.

An area of the semiconductor pattern overlapped by the source electrode or the drain electrode is defined as an overlap area and the rest of the semiconductor pattern is defined as a non-overlap area. A concentration of Mo may be higher in the overlap area than in the non-overlap area.

The concentration of Mo may gradually decrease from a top portion to a bottom portion of the non-overlap area.

The display device may also include a second barrier layer disposed on the data wiring.

The second barrier layer may contain a metal oxide.

The data wiring may include oxide areas that are formed on outer sides of the data wiring.

According to another exemplary embodiment, a display device includes: a substrate; a gate electrode disposed on the substrate; a semiconductor pattern disposed on the gate electrode; data wiring formed on the semiconductor pattern and comprising a data line, a source electrode, and a drain electrode; a first barrier layer disposed between the data wiring and the semiconductor pattern; and a molybdenum oxide layer disposed on a part of the semiconductor pattern between the source and drain electrodes.

The molybdenum oxide layer may cover at least a part of a top surface of the semiconductor pattern.

A channel portion may be formed between the source and drain electrodes, and the molybdenum oxide layer may partially overlap the channel portion.

The first barrier layer may include molybdenum oxide areas that contain molybdenum oxide, and Mo areas that contain Mo, but no molybdenum oxide.

The molybdenum oxide areas may be provided on outer sides of each segment of the first barrier layer, and the Mo areas may be respectively provided inside the molybdenum oxide areas.

A concentration of molybdenum oxide in each of the molybdenum oxide areas may gradually decrease from an outer side to an inner side of a corresponding molybdenum oxide area.

The semiconductor pattern may contain Mo.

According to another exemplary embodiment, a manufacturing method of a display device includes: preparing a substrate on which a gate electrode, a semiconductor layer disposed on the gate electrode, a first barrier layer disposed on the semiconductor layer and containing Mo, a conductive layer disposed on the first barrier layer, and a second barrier layer disposed on the conductive layer are formed; forming a first photosensitive layer pattern having, on the conductive layer, a first area, in which the first photosensitive layer pattern has a first thickness, and a second area, in which the first photosensitive layer pattern has a second thickness that is larger than the first thickness, and forming a data line and a semiconductor pattern by etching the semiconductor layer, the first barrier layer, the conductive layer, and the second barrier layer using the photosensitive layer pattern as a mask; forming a second photosensitive layer pattern that exposes a part of the conductive layer, by removing the first area of the first photosensitive layer pattern, forming a source electrode, a drain electrode, and a channel portion that is disposed between the source and drain electrodes, by etching the second barrier layer and the conductive layer using the second photosensitive layer pattern as a mask, and removing the second photosensitive layer pattern; forming a molybdenum oxide layer on a segment of the first barrier layer corresponding to the channel portion and molybdenum oxide areas on outer sides of each of segments of the first barrier layer overlapped by the source electrode, the drain electrode, and the data line by oxidizing the substrate; and at least partially removing the molybdenum oxide layer by rinsing the substrate.

The at least partially removing the molybdenum oxide layer, may include forming an undercut in the molybdenum oxide areas.

The forming the molybdenum oxide layer and the molybdenum oxide areas, may include forming oxidized areas on outer sides of each of the source electrode, the drain electrode, and the data line.

The at least partially removing the molybdenum oxide layer, may include rinsing the substrate with water.

The oxidizing the substrate and the rinsing the substrate may be performed at least twice.

According to the exemplary embodiments, the distribution of TFTs may be improved by uniformly maintaining the height of semiconductor patterns.

In addition, TFTs with excellent properties may be obtained by preventing contamination of the top of semiconductor patterns in a display device.

Other features and exemplary embodiments will be apparent from the following detailed description, the drawings, and the claims.

DETAILED DESCRIPTION OF THE EMBODIMENTS

Figure 1:
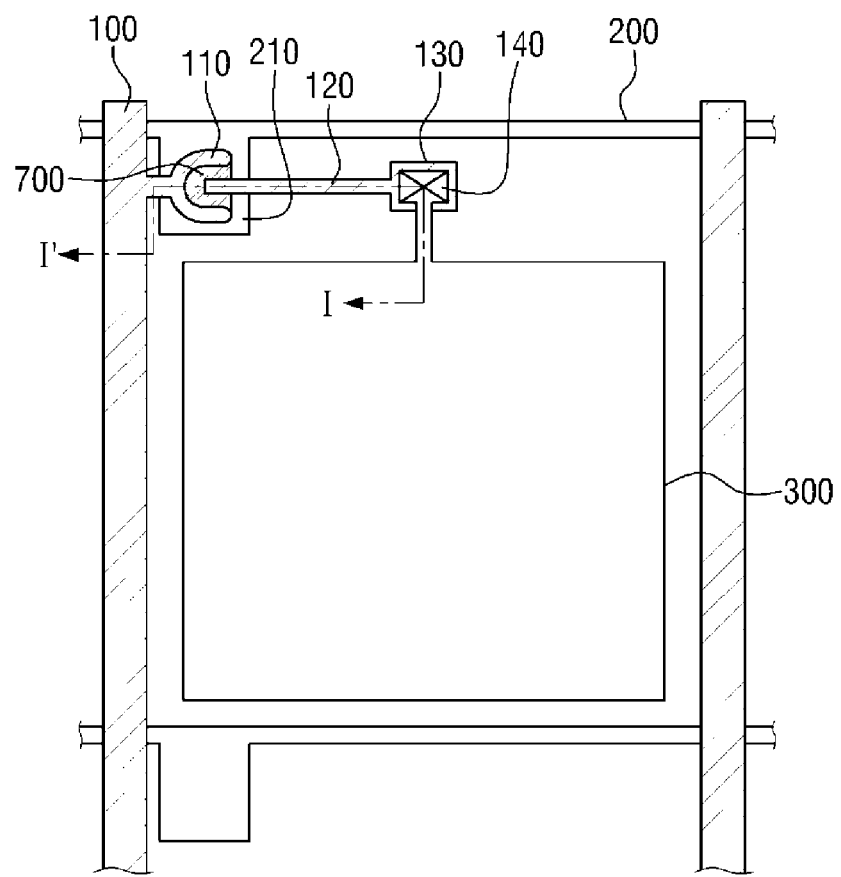
FIG. 1 is a partial plan view of a display device according to an exemplary embodiment.

The aspects and features of the present disclosure and methods for achieving the aspects and features will be apparent by referring to the embodiments described in detail with reference to the accompanying drawings. However, the present disclosure is not limited to the embodiments disclosed herein, but can be implemented in diverse forms. The matters defined in the description, such as the detailed construction and elements, are nothing but specific details provided to assist those of ordinary skill in the art in a comprehensive understanding of the present disclosure, and the present may be defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present disclosure, the same drawing reference numerals are used for the same elements across various figures.

Although the terms "first, second, and so forth" may be used to describe diverse constituent elements, such constituent elements are not limited by the terms. The terms are used to discriminate a constituent element from other constituent elements. Accordingly, in the following description, a first constituent element may include a second constituent element. Hereinafter, embodiments of the present disclosure will be described with reference to the attached drawings.

Figure 2:
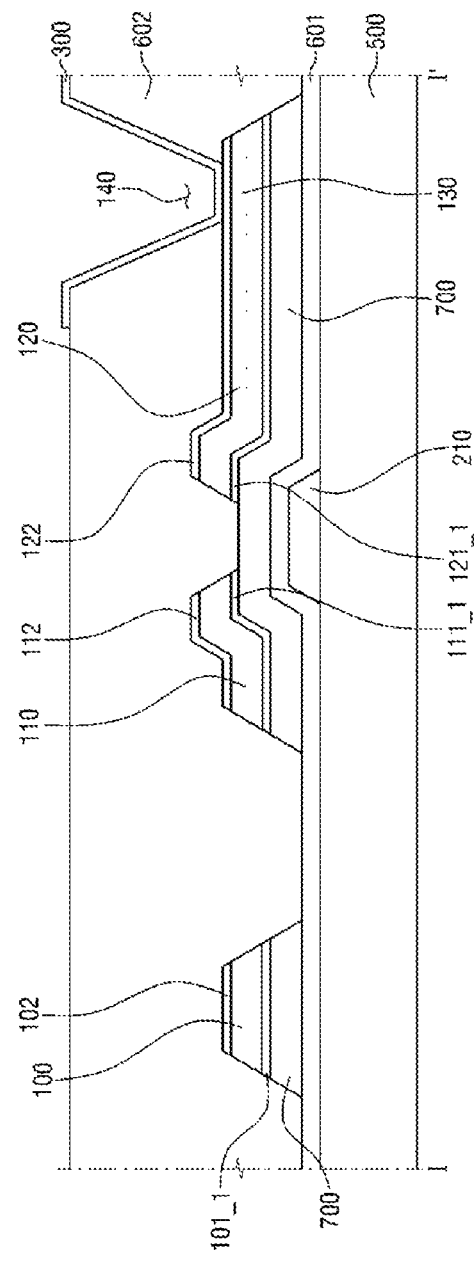
FIG. 2 is a cross-sectional view taken along line I-I' of FIG. 1.

FIG. 1 is a partial plan view of a display device according to an exemplary embodiment. FIG. 2 is a cross-sectional view taken along line I-I' of FIG. 1.

Referring to FIGS. 1 and 2, the display device includes a substrate 500, a gate electrode 210 that is disposed on the substrate 500, a semiconductor pattern 700 that is disposed on the gate electrode 210, data wiring (100, 110, 120, and 130) that is disposed on the semiconductor pattern 700 and includes a data line 100, a source electrode 110, a drain electrode 120, and a drain electrode extension 130, and a first barrier layer (101_1, 111_1, and 121_1) that is disposed between the semiconductor pattern 700 and the data wiring (100, 110, 120, and 130).

The substrate 500 may be formed of a transmissive material. The substrate 500 may be formed of, for example, transparent glass or plastic, but the present disclosure is not limited thereto.

Gate wiring (200 and 210) that extends in a first direction may be disposed on the substrate 500. As illustrated in FIG. 1, the first direction may be, but is not limited to, a horizontal direction. The gate wiring (200 and 210) may include a gate line 200 that transmits a gate signal, a gate electrode 210 that protrudes from the gate line 200 in the form of a projection, and a gate terminal (not illustrated) that is disposed at at least one end of the gate line 200. The gate electrode 210 may form the three terminals of a thin-film transistor (TFT) together with the source and drain electrodes 110 and 120.

The gate wiring (200 and 210) may contain at least one of an aluminum (Al)-based metal, including an Al alloy, a silver (Ag)-based metal, including an Ag alloy, a copper (Cu)-based metal, including a Cu alloy, a molybdenum (Mo)-based metal, including a Mo alloy, chromium (Cr), titanium (Ti), and tantalum (Ta), but the present disclosure is not limited thereto. That is, any metal or polymer material having suitable physical properties for realizing a desired display device may be used as the material of the gate wiring (200 and 210).

The gate wiring (200 and 210) may have a single-layer structure, but the present disclosure is not limited thereto. That is, alternatively, the gate wiring (200 and 210) may have a multilayer structure, such as a double- or triple-layer structure.

A gate insulating layer 601 may be disposed on the gate wiring (200 and 210). The gate insulating layer 601 may cover the gate wiring (200 and 210), and may be formed on the entire surface of the substrate 500.

The gate insulating layer 601 may be formed of an inorganic insulating material such as silicon oxide (SiOx), silicon nitride (SiNx), and silicon oxynitride (SiON), but the present disclosure is not limited thereto.

The semiconductor pattern 700 may be disposed on the gate insulating layer 601. The semiconductor pattern 700 may include an oxide semiconductor. More specifically, the semiconductor pattern 700 may include a mixed oxide, such as ZnO, InZnO, InGaO, InSnO, ZnSnO, GaSnO, GaZnO, GaZnSnO, GaInZnO, or indium zinc tin oxide (IZTO) (InZnTinO), but the present disclosure is not limited thereto.

The semiconductor pattern 700 including an oxide semiconductor may have 2 to 100 times greater effective charge mobility than an amorphous silicon semiconductor pattern and has an on/off current ratio of $10^5$ to $10^8$. Thus, the semiconductor pattern 700 shows excellent semiconductor properties, compared to an amorphous semiconductor pattern. Furthermore, the band gap of the semiconductor pattern 700 may range between about 3.0 and 3.5 eV. Thus, no leakage photoelectric current may be generated for visible light. Accordingly, instantaneous afterimages of oxide TFTs may be prevented, making it unnecessary to form a light blocking layer under the oxide TFTs and thus increasing the aperture ratio of the display device.

In order to enhance the properties of the oxide semiconductor, the semiconductor pattern 700 may further include a Group 3, Group 4, Group 5, or a transition element from the periodic table.

The aforementioned materials used to form the oxide semiconductor of the semiconductor pattern 700 show excellent ohmic contact properties with respect to the data wiring (100, 110, 120, and 130), making it unnecessary to additionally provide an ohmic contact layer and thus reducing the amount of time and expenditure required to fabricate the display device. However, the present disclosure is not limited to this. That is, alternatively, an ohmic contact layer may be additionally provided between the semiconductor pattern 700 including an oxide semiconductor and the data wiring (100, 110, 120, and 130).

The semiconductor pattern 700 may have various shapes such as an island shape and a linear shape. The semiconductor pattern 700 having a linear shape may be provided below the data wiring (100, 110, 120, and 130) and may extend to the top of the gate electrode 210.

In a case where a four-mask process is used, the semiconductor pattern 700 may be patterned into substantially the same shape as the data wiring (100, 110, 120, and 130) in all areas except for a channel portion of the TFT. That is, the semiconductor pattern 700 may be disposed to overlap the data wiring (100, 110, 120, and 130) in all the areas except for the channel portion of the TFT.

In the present exemplary embodiment, a four-mask process may be used, but the present disclosure is not limited thereto. That is, a three- or five-mask process may be used without departing from the scope of the present disclosure. In other words, it is obvious to a person skilled in the art to which the present disclosure pertains that a three-mask process, a five-mask process, or a combination thereof can be used instead of a four-mask process.

The first barrier layer (101_1, 111_1, and 121_1) may be disposed on the semiconductor pattern 700 and the gate insulating layer 601. The first barrier layer (101_1, 111_1, and 121_1) may overlap the entire data wiring (100, 110, 120, and 130) or parts of the data wiring (100, 110, 120, and 130).

The first barrier layer (101_1, 111_1, and 121_1) may include Mo or molybdenum oxide. The first barrier layer (101_1, 111_1, and 121_1) may include molybdenum oxide areas and Mo areas. The Mo areas may be areas including Mo, but no molybdenum oxide. The molybdenum oxide areas may include molybdenum oxide only or both molybdenum oxide and Mo.

Referring to FIG. 2, the first barrier layer (101_1, 111_1, and 121_1) may be disposed to overlap the source electrode 110, the drain electrode 120, the drain electrode extension 130, and the data line 100. FIG. 2 illustrates the first barrier layer (101_1, 111_1, and 121_1) as being overlapped by the entire source electrode 110, the entire drain electrode 120, and the entire data line 100, but in an alternative exemplary embodiment, the first barrier layer (101_1, 111_1, and 121_1) may be overlapped only by parts of the source electrode 110, the drain electrode 120, and the data line 100.

More specifically, the first barrier layer segment 111_1 may be disposed below the source electrode 110 to be overlapped by the source electrode 110. Sidewalls of the first barrier layer segment 111_1 may be respectively aligned with sidewalls of the source electrode 110, but the present disclosure is not limited thereto. For example, an outer part of the first barrier layer segment 111_1 may be formed of molybdenum oxide, and an inner part of the first barrier layer segment 111_1 may be formed of Mo, which will be described later in detail.

The first barrier layer segment 121_1 may be disposed below the drain electrode 120 and the drain electrode extension 130 to be overlapped by the drain electrode 120 and the drain electrode extension 130. Sidewalls of the first barrier layer segment 121_1 may be respectively aligned with sidewalls of the drain electrode 120 and the drain electrode extension 130, but the present disclosure is not limited thereto. For example, an outer part of the first barrier layer segment 121_1 may be formed of molybdenum oxide, and an inner part of the first barrier layer segment 121_1 may be formed of Mo.

The first barrier layer segment 101_1 may be disposed below the data line 100 to be overlapped by the data line 100. Sidewalls of the first barrier layer segment 101_1 may be respectively aligned with sidewalls of the data line 100, but the present disclosure is not limited thereto. For example, an outer part of the first barrier layer segment 101_1 may be formed of molybdenum oxide, and an inner part of the first barrier layer segment 101_1 may be formed of Mo.

The data wiring (100, 110, 120, and 130) may be disposed on the semiconductor pattern 700, the gate insulating layer 601, and the first barrier layer (101_1, 111_1, and 121_1). The data wiring (100, 110, 120, and 130) may include the data line 100 that extends in a second direction, for example, a vertical direction, and intersects the gate line 200, the source electrode 110 that is branched off from the data line 100 in the form of a branch and extends to the top of the semiconductor pattern 700, the drain electrode 120 that is isolated from the source electrode HO and is disposed over the semiconductor pattern 700 to face the source electrode HO with respect to the gate electrode 210 or the channel portion of the TFT, and the drain electrode extension 130 that extends from the drain electrode 120 and electrically contacts a pixel electrode 300. The drain electrode extension 130 may have a relatively larger width than the drain electrode 120 and may thus enable a stable electric contact with the pixel electrode 300.

The data wiring (100, 110, 120, and 130) may have a single- or multilayer structure including a metal such as nickel (Ni), cobalt (Co), Ti, Ag, Cu, Mo, Al, beryllium (Be), niobium (Nb), gold (Au), iron (Fe), selenium (Se), or Ta, and further including, in addition to the metal, an alloy including at least one selected from a group including Ti, zirconium (Zr), tungsten (W), Ta, Nb, platinum (Pt), hafnium (Hf), oxygen (O) and nitrogen (N), but the present disclosure is not limited thereto. That is, the material of the data wiring (100, 110, 120, and 130) is not particularly limited to the examples described above.

A second barrier layer (102, 112, and 122) may be disposed on the data wiring (100, 110, 120, and 130). The second barrier layer (102, 112, and 122) may be disposed to be overlapped by the entire data wiring (100, 110, 120, and 130) or parts of the data wiring (100, 110, 120, and 130). That is, for example, the second barrier layer (102, 112, and 122), the data wiring (100, 110, 120, and 130), and the first barrier layer (101_1, 111_1, and 121_1) overlap one another, thereby forming a triple-layer structure. Sidewalls of the second barrier layer (102, 112, and 122) may be aligned with respective sidewalls of the data wiring (100, 110, 120, and 130), but the present disclosure is not limited thereto. That is, alternatively, the sidewalls of the second barrier layer (102, 112, and 122) may protrude beyond, or may be recessed from, the respective sidewalls of the data wiring (100, 110, 120, and 130).

The second barrier layer (102, 112, and 122) may be formed of a metal oxide. In a case where the second barrier layer (102, 112, and 122) is formed of a metal oxide, the second barrier layer (102, 112, and 122) may prevent the data wiring (100, 110, 120, and 130) disposed therebelow from being oxidized during a substrate oxidization process.

FIG. 1 illustrates that a single TFT is disposed in a single pixel, but the present disclosure is not limited thereto. That is, in other exemplary embodiments, a plurality of TFTs may be provided in each pixel, in which case, all or only some of the TFTs may be the TFT of the display device. For example, if a total of three TFTs are provided in each pixel, one to three TFTs of each pixel are the TFT of the display device according to the present exemplary embodiment.

A passivation layer 602 may be disposed on the data wiring (100, 110, 120, and 130), the second barrier layer (102, 112, and 122), and the semiconductor pattern 700. The passivation layer 602 may include an inorganic insulating material. For example, the passivation layer 602 may be formed of silicon oxide, silicon nitride, silicon oxynitride, aluminum oxynitride, titanium oxynitride, zirconium oxynitride, hafnium oxynitride, tantalum oxynitride, or tungsten oxynitride, but the present disclosure is not limited thereto. That is, the material of the passivation layer 602 is not particularly limited to the examples described above.

A contact hole 140 may be formed on the passivation layer 602 to expose the drain electrode extension 130.

The pixel electrode 300 may be disposed on the passivation layer 602. The pixel electrode 300 may be electrically connected to the drain electrode 120 via the contact hole 140 formed on the passivation layer 602.

For example, the pixel electrode 300 may be formed of a transparent conductor such as indium tin oxide (ITO), indium zinc oxide (IZO), or a reflective conductor such as Al.

FIG. 1 illustrates the pixel electrode 300 as having a plate shape, but the present disclosure is not limited thereto. That is, in other exemplary embodiments, the pixel electrode 300 may have a structure with one or more slits. In still other exemplary embodiments, a plurality of pixel electrodes 300 may be provided in each pixel, in which case, different voltages may be applied to the plurality of pixel electrodes 300.

Display devices according to other exemplary embodiments of the present disclosure will hereinafter be described with reference to FIGS. 3 to 8. In FIGS. 1 to 8, like reference numerals represent like elements, and thus, detailed descriptions thereof may be omitted.

Figure 3:
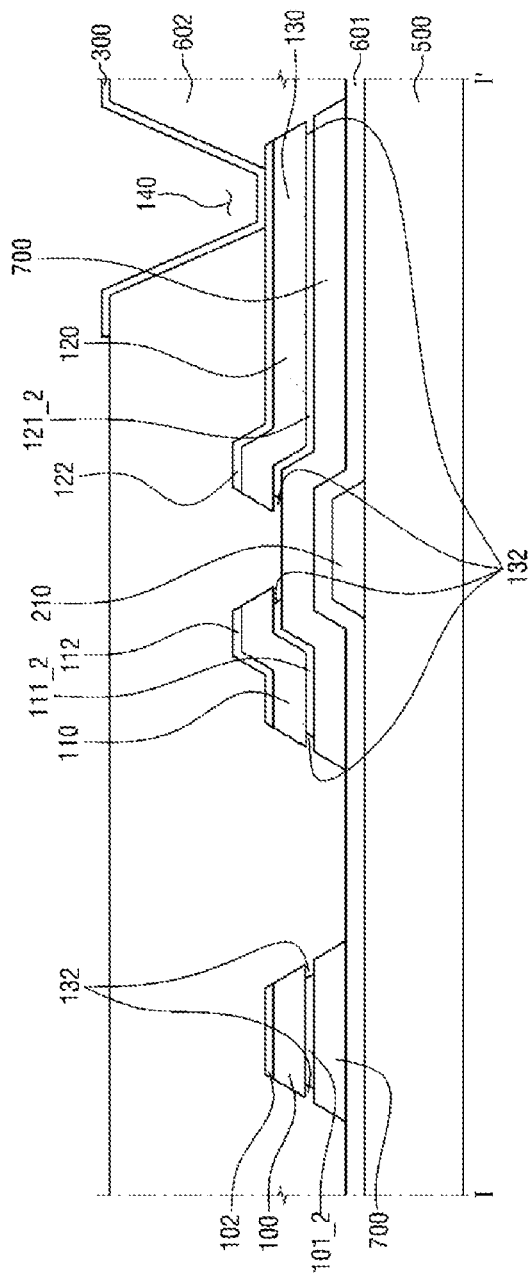
FIG. 3 is a cross-sectional view of a display device according to another exemplary embodiment.

FIG. 3 is a cross-sectional view of a display device according to another exemplary embodiment.

Referring to FIG. 3, the display device may include undercuts 132 that are formed on at least one side of each segment of a first barrier layer (101_2, 111_2, and 121_2). Sidewalls of the first barrier layer (101_2, 111_2, and 121_2) may be positioned inside relative to respective sidewalls of data wiring (110, 120, 100, and 130).

For example, the sidewalls of the first barrier layer (101_2, 111_2, and 121_2) may be formed inside relative to the respective sidewalls of the data wiring (110, 120, 100, and 130). In other words, the sidewalls of the data wiring (110, 120, 100, and 130) may protrude beyond the respective sidewalls of the first barrier layer (101_2, 111_2, and 121_2), partly due to, but is not limited to, how the display device according to the present exemplary embodiment is fabricated.

The undercuts 132 may be formed on both sidewalls of each segment of the first barrier layer (101_2, 111_2, and 121_2). FIG. 3 illustrates the undercuts 132 as being formed on both sidewalls of each segment of the first barrier layer (101_2, 111_2, and 121_2), but the present disclosure is not limited thereto. That is, alternatively, the undercuts 132 may be formed only on the sidewalls of at least one selected from a group including a first barrier layer segment 111_2 disposed below a source electrode 110, a first barrier layer segment 121_2 disposed below a drain electrode 120, and a first barrier layer segment 101_2 disposed below a data line 100. Still alternatively, the undercuts 132 may be formed only on one of the sidewalls of each of the first barrier layer segments 111_2, 121_2, and 101_2. That is, one of the sidewalls of each of the first barrier layer segments 111_2, 121_2, and 101_2 may be aligned with a corresponding sidewall of the data wiring (110, 120, and 100), and the undercuts 132 may be formed on the other sidewall of each of the first barrier layer segments 111_2, 121_2, and 101_2. The first barrier layer (101_2, 111_2, and 121_2) may include Mo and molybdenum oxide. That is, the first barrier layer (101_2, 111_2, and 121_2) may include molybdenum oxide areas including molybdenum oxide and Mo areas including Mo, but no molybdenum oxide. The molybdenum oxide areas may include molybdenum oxide alone or both molybdenum oxide and Mo. The undercuts 132 may be formed in the molybdenum oxide areas. Molybdenum oxide in the molybdenum oxide areas may be washed away during a water rinsing process, which will be described later, and as a result, the undercuts 132 may be formed in the molybdenum oxide areas.

The sidewalls of the first barrier layer (101_2, 111_2, and 121_2) where the undercuts 132 are formed may be tapered. That is, the sidewalls of the first barrier layer (101_2, 111_2, and 121_2) may be upwardly inclined so that upper ends of the sidewalls of the first barrier layer (101_2, 111_2, and 121_2) may be respectively positioned inside relative to the lower ends of the sidewalls of the first barrier layer (101_2, 111_2, and 121_2).

Figure 4:
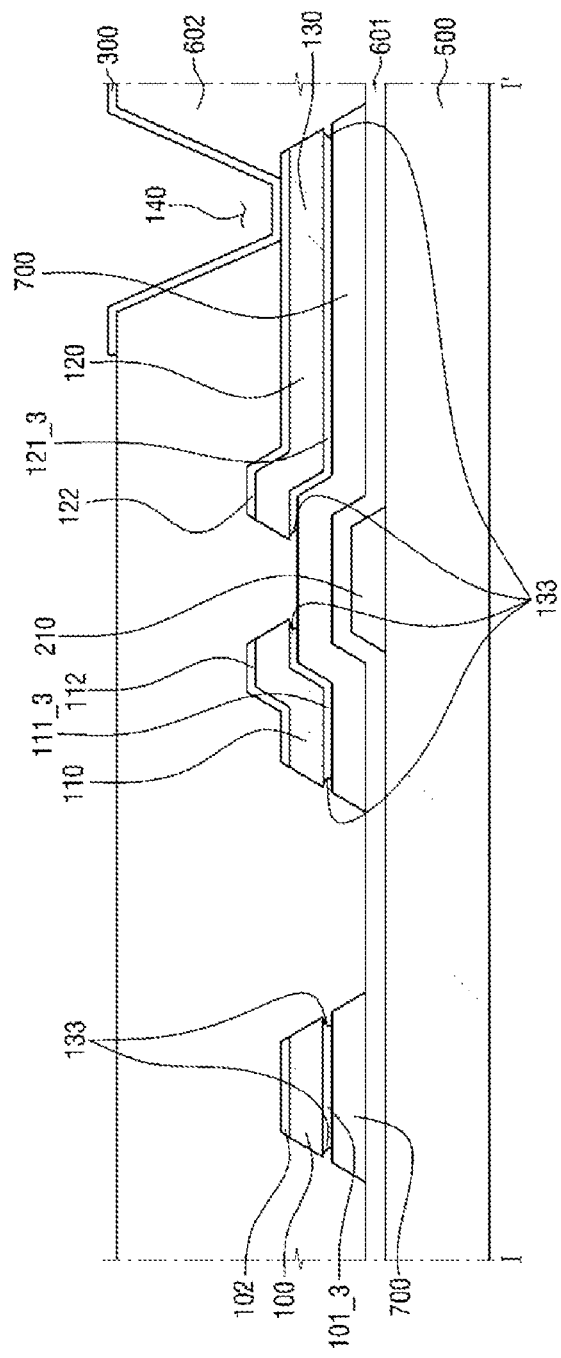
FIG. 4 is a cross-sectional view of a modified example of the display device of FIG. 3.

FIG. 4 is a cross-sectional view of a modified example of the display device of FIG. 3. The display device of FIG. 4 differs from the display device of FIG. 3 in that undercuts 133 are formed on both sides of each segment of a first barrier layer (101_3, 111_3, and 121_3), and that the sidewalls of each segment of the first barrier layer (101_3, 111_3, and 121_3) may be reversely tapered.

The undercuts 133 may be formed on both sidewalls of each segment of the first barrier layer (101_3, 111_3, and 121_3). FIG. 4 illustrates the undercuts 133 as being formed on both sidewalls of each segment of the first barrier layer (101_3, 111_3, and 121_3), but the present disclosure is not limited thereto. That is, alternatively, the undercuts 133 may be formed only on the sidewalls of at least one selected from a group including a first barrier layer segment 111_3 disposed below a source electrode 110, a first barrier layer segment 121_3 disposed below a drain electrode 120, and a first barrier layer segment 101_3 disposed below a data line 100. Still alternatively, the undercuts 133 may be formed only on one of the sidewalls of each of the first barrier layer segments 111_3, 121_3, and 101_3. That is, one of the sidewalls of each of the first barrier layer segments 111_3, 121_3, or 101_3 may be aligned with a respective sidewall of the data wiring (110, 120, and 100), and the undercuts 133 may be formed on the other sidewall of each of the first barrier layer segments 111_3, 121_3, or 101_3.

The sidewalls of the first barrier layer (101_3, 111_3, and 121_3) where the undercuts 133 are formed may be reversely tapered. That is, the sidewalls of the first barrier layer (101_3, 111_3, and 121_3) may be downwardly inclined so that upper ends of the sidewalls of each of the first barrier layer (101_3, 111_3, and 121_3) may be respectively positioned outside relative to the lower ends of the sidewalls of the first barrier layer (101_3, 111_3, and 121_3).

The first barrier layer (101_3, 111_3, and 121_3) may include Mo and molybdenum oxide. That is, the first barrier layer (101_3, 111_3, and 121_3) may include molybdenum oxide areas including molybdenum oxide and Mo areas including Mo, but no molybdenum oxide. That is, the molybdenum oxide areas may include molybdenum oxide alone or both molybdenum oxide and Mo. The undercuts 133 may be formed in the molybdenum oxide areas. Molybdenum oxide in the molybdenum oxide areas may be washed away during a water rinsing process, which will be described later, and as a result, the undercuts 133 may be formed in the molybdenum oxide areas.

Figure 5:
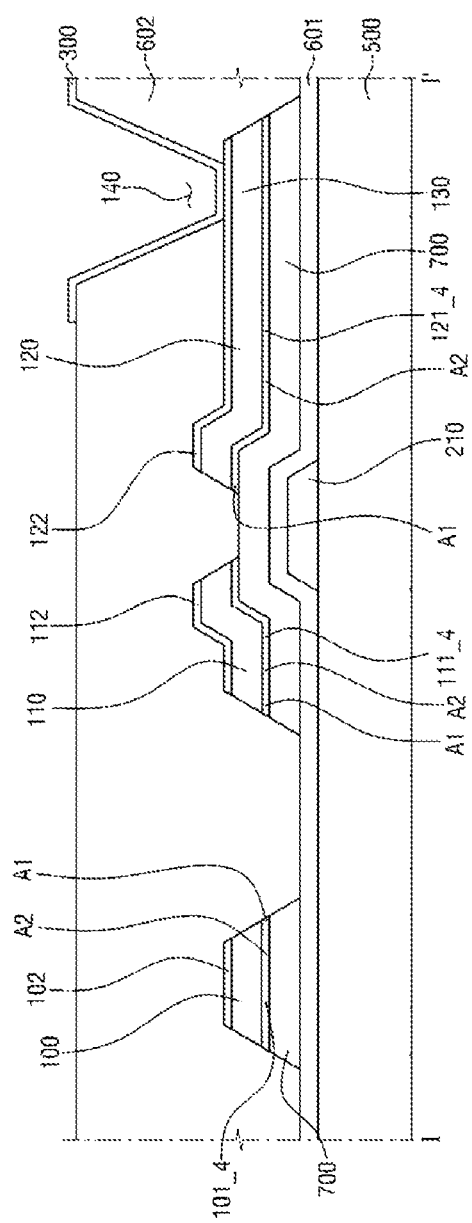
FIG. 5 is a cross-sectional view of a display device according to another exemplary embodiment.

FIG. 5 is a cross-sectional view of a display device according to another exemplary embodiment.

Referring to FIG. 5, molybdenum oxide areas A1 may be provided on outer sides of each segment of a first barrier layer (101_4, 111_4, and 121_4), and Mo areas A2 may be provided on an inner side of each segment of the first barrier layer (101_4, 111_4, and 121_4).

The term "outer sides of each segment of a first barrier layer", as used herein, may denote regions including, or near, the sidewalls of each segment of the first barrier layer (101_4, 111_4, and 121_4), and the term "inner sides of each segment of a first barrier layer segment", as used herein, may denote the entire first barrier layer (101_4, 111_4, and 121_4) except for the outer sides of each segment of the first barrier layer (101_4, 111_4, and 121_4). That is, a first barrier layer segment 111_4 that is disposed below a source electrode 110 may include a Mo area A2 on an inner side thereof and a molybdenum oxide area A1 outside the Mo area A2. As described above, the molybdenum oxide area A1 of the first barrier layer segment 111_4 may include molybdenum oxide, and the Mo area A2 of the first barrier layer segment 111_4 may include Mo, but no molybdenum oxide. That is, the molybdenum oxide area A1 of the first barrier layer segment 111_4 may include molybdenum oxide alone or both molybdenum oxide and Mo.

A first barrier layer segment 121_4 that is disposed below a drain electrode 120 may include a Mo area A2 on an inner side thereof and a molybdenum oxide area A1 outside the Mo area A2. As described above, the molybdenum oxide area A1 of the first barrier layer segment 121_4 may include molybdenum oxide, and the Mo area A2 of the first barrier layer segment 121_4 may include Mo, but no molybdenum oxide. That is, the molybdenum oxide area A1 of the first barrier layer segment 121_4 may include molybdenum oxide alone or both molybdenum oxide and Mo.

A first barrier layer segment 101_4 that is disposed below a data line 100 may include a Mo area A2 on an inner side thereof and a molybdenum oxide area A1 outside the Mo area A2. As described above, the molybdenum oxide area A1 of the first barrier layer segment 101_4 may include molybdenum oxide, and the Mo area A2 of the first barrier layer segment 101_4 may include Mo, but no molybdenum oxide. That is, the molybdenum oxide area A1 of the first barrier layer segment 101_4 may include molybdenum oxide alone or both molybdenum oxide and Mo.

Figure 6:
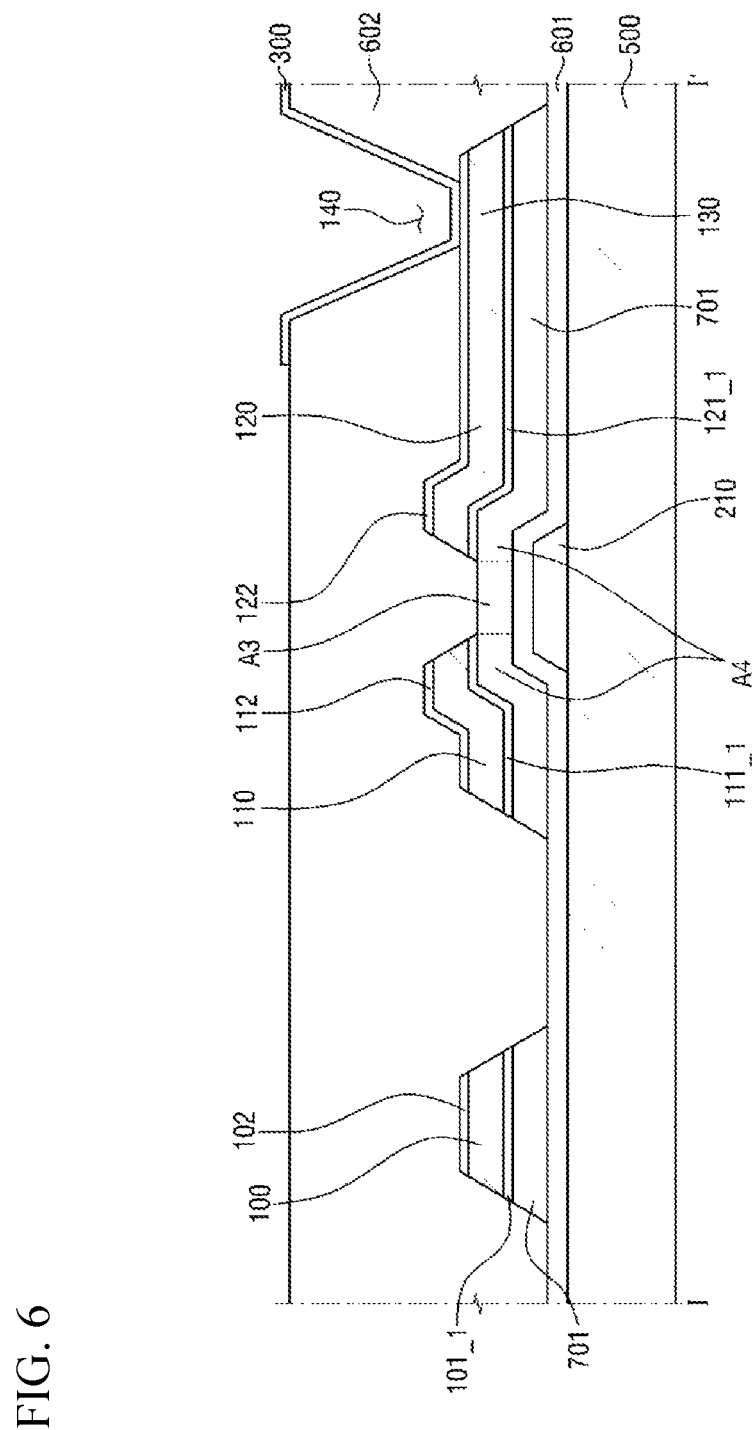
FIG. 6 is a cross-sectional view of a display device according to another exemplary embodiment.

FIG. 6 is a cross-sectional view of a display device according to another exemplary embodiment.

Referring to FIG. 6, a semiconductor pattern 701 may include Mo. More specifically, the semiconductor pattern 701 may include Mo in addition to an oxide semiconductor. The Mo of the semiconductor pattern 701 may originate through diffusion from a first barrier layer (101_1, 111_1, and 121_1), but the present disclosure is not limited thereto.

The concentration of Mo in the semiconductor pattern 701 may be relatively higher in an upper part of the semiconductor pattern 701 than in a lower part of the semiconductor pattern 701. That is, the concentration of Mo in the semiconductor pattern 701 may gradually decrease from the top portion to the bottom portion of the semiconductor pattern 701. As a result, the concentration of Mo in the lower part of the semiconductor pattern 701 may be lower than the concentration of Mo in the upper part of the semiconductor pattern 701 or may even be zero. That is, there may be no Mo contained in the lower part of the semiconductor pattern 701.

In the present exemplary embodiment, an overlap area A4 where the semiconductor pattern 701 overlaps a source electrode 110 or a drain electrode 120, and a non-overlap area A3 of the semiconductor pattern 701 that corresponds to a channel portion of a TFT, may be defined. For example, the concentration of Mo in the overlap area A4 may be higher than the concentration of Mo in the non-overlap area A3, partly due to, but is not limited to, how the display device according to the present exemplary embodiment is fabricated.

Figure 7A:
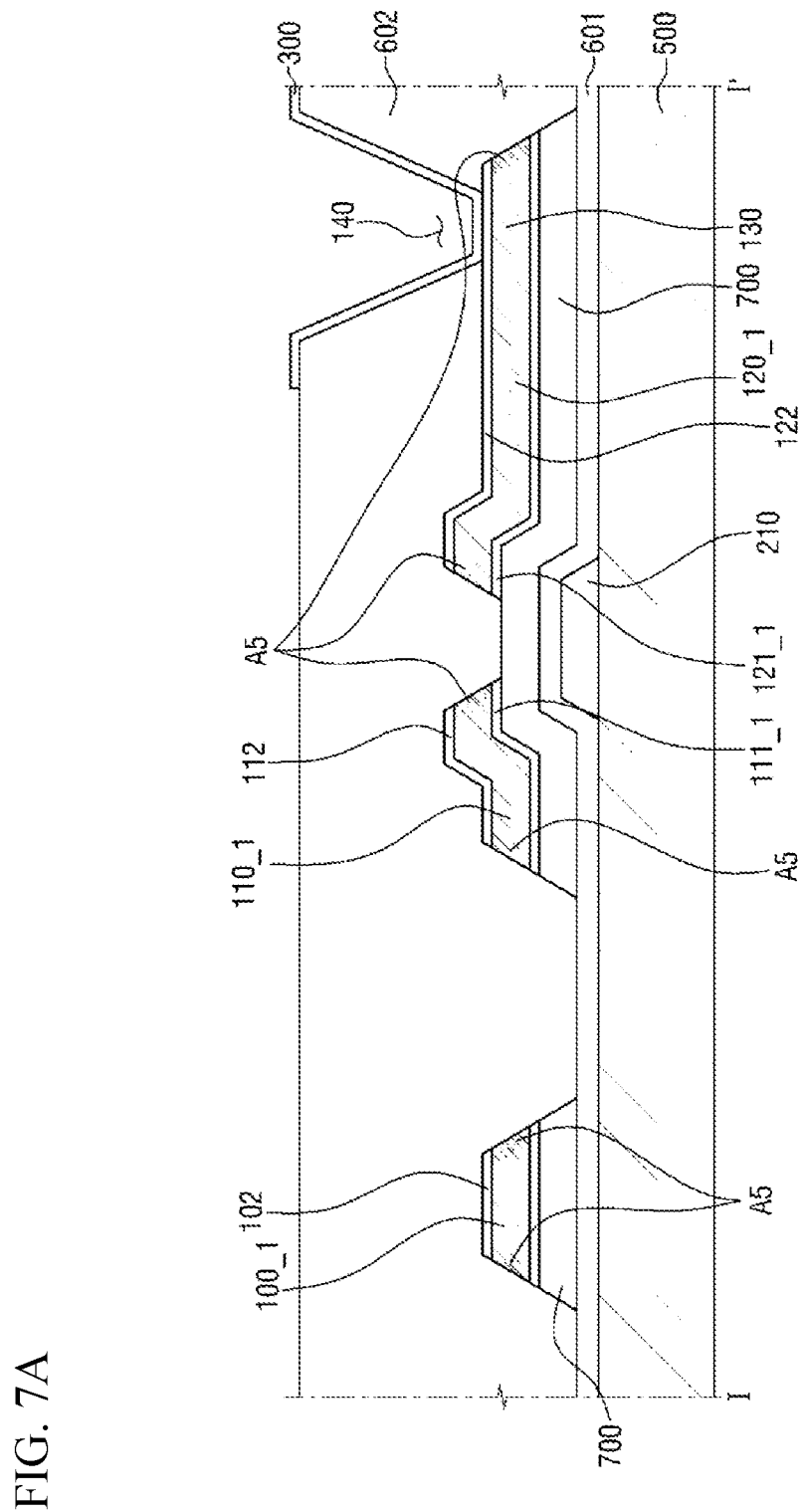
FIG. 7A is a cross-sectional view of a display device according to another exemplary embodiment.

FIG. 7A is a cross-sectional view of a display device according to another exemplary embodiment.

Referring to FIG. 7A, the display device may include oxidized areas A5 where data wiring (110_1, 120_1, and 100_1) is at least partially oxidized. The data wiring (110_1, 120_1, and 100_1) may be at least partially oxidized, and parts of the data wiring (110_1, 120_1, and 100_1) that are oxidized will hereinafter be referred to as the oxidized areas A5. The oxidized areas A5 may be provided on outer sides of the data wiring (110_1, 120_1, and 100_1).

FIG. 7A illustrates the oxidized area A5 as being provided on both sidewalls of the data wiring (110_1, 120_1, and 100_1), but the present disclosure is not limited thereto. That is, alternatively, the oxidized area A5 may be provided only on the sidewalls of at least one selected from a group including a source electrode 110_1, a drain electrode 120_1, and a data line 100_1. Still alternatively, the oxidized area A5 may be provided only on one of the sidewalls of the data wiring (110_1, 120_1, and 100_1).

Figure 7B:
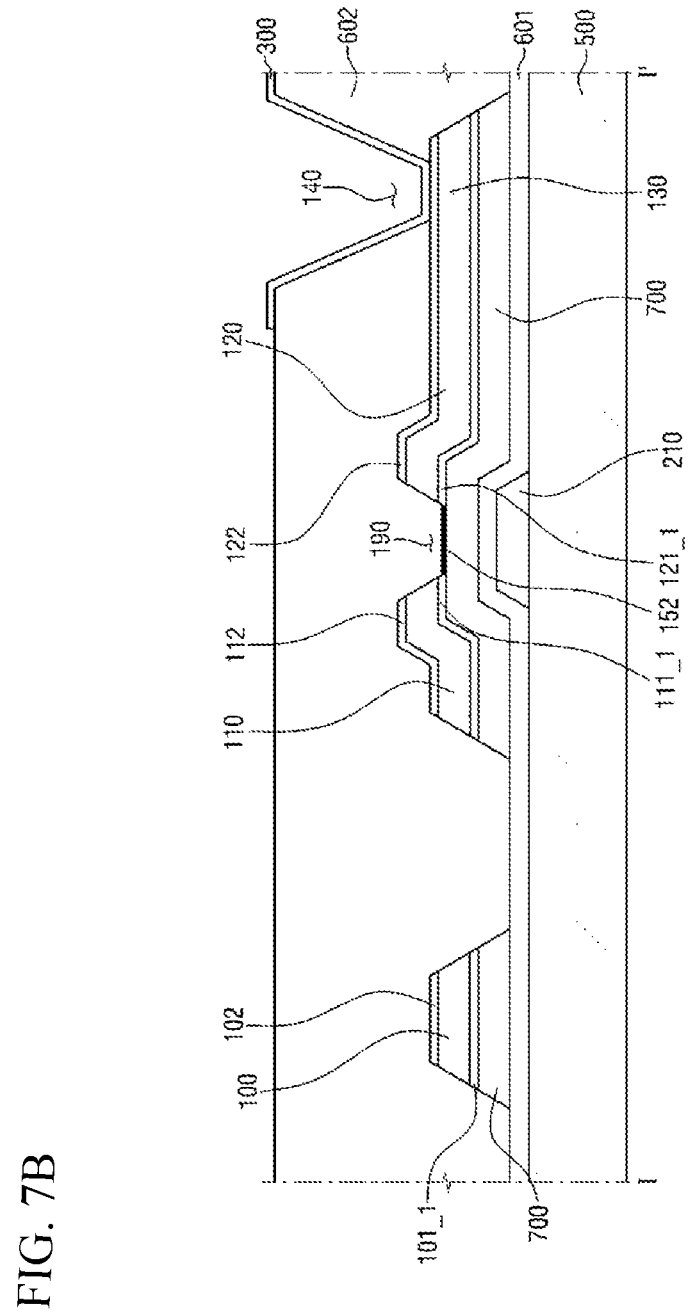
FIG. 7B is a cross-sectional view of a display device according to another exemplary embodiment.

FIG. 7B is a cross-sectional view of a display device according to another exemplary embodiment.

The display device of FIG. 7B differs from the display device of FIG. 2 in that a molybdenum oxide layer 152 is disposed between a source electrode 110 and a drain electrode 120.

The molybdenum oxide layer 152 may be disposed on a semiconductor pattern 700. More specifically, the molybdenum oxide layer 152 may be disposed to cover at least a part of the top surface of the semiconductor pattern 700 that is exposed between the source and drain electrodes 110 and 120. Accordingly, the molybdenum oxide layer 152 may at least partially overlap a channel portion 190.

The molybdenum oxide layer 152 may be formed of molybdenum oxide alone.

The thickness of the molybdenum oxide layer 152 may be smaller than the thickness of a first barrier layer segment 111_1 that is overlapped by the source electrode 110 and the thickness of a first barrier layer segment 121_1 that is overlapped by the drain electrode 120, partly due to, but is not limited to, how the display device according to the present exemplary embodiment is fabricated.

In a case where the molybdenum oxide layer 152 is disposed on the semiconductor pattern 700, a metal material forming data wiring (110, 120, and 100) may be diffused to the top surface of the semiconductor pattern 700, and as a result, degradation of the electrical properties of the semiconductor pattern 700 may be prevented.

Figure 8:
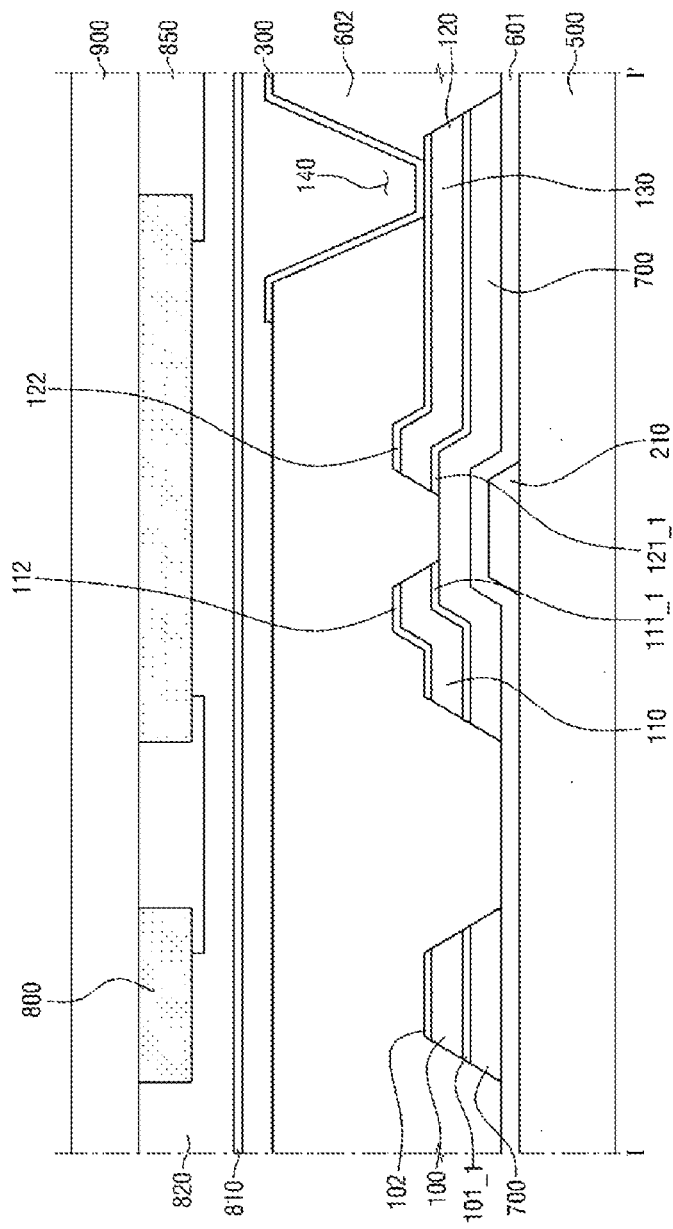
FIG. 8 is a cross-sectional view of a display device according to another exemplary embodiment.

FIG. 8 is a cross-sectional view of a display device according to another exemplary embodiment. More specifically, FIG. 8 illustrates a vertical alignment (VA)-mode display device according to an exemplary embodiment.

Referring to FIG. 8, the display device may include an upper substrate 900 that faces a substrate 500, a black matrix 800, color filters 850, an overcoat layer 820, and a common electrode 810 that are disposed on the upper substrate 900.

That is, the black matrix 800 that is a light-blocking member for preventing light leakage and light interference between adjacent pixel regions may be disposed on the upper substrate 900. The color filters 850 that are of red, green, and blue colors may be respectively provided in pixels. The overcoat layer 820 that is formed of an organic material may be disposed on the black matrix 800 and the color filters 850. The overcoat layer 820 may be one or a combination of well-known overcoat layers, and thus, a detailed description thereof may be omitted.

The common electrode 810 may be disposed on the overcoat layer 820. The common electrode 810 may be a full-surface electrode, and may be formed of a transparent conductor such as ITO, IZO, or a reflective conductor such as Al.

FIG. 8 illustrates the color filters 850 and the black matrix 800 as being disposed on the upper substrate 900, but in an alternative exemplary embodiment, the color filters 850 and/or the black matrix 800 may be disposed on the substrate 500. That is, the display device according to the present exemplary embodiment may also be applicable to a color filter on array (COA)- or black column spacer (BCS)-mode liquid crystal display (LCD).

FIG. 8 illustrates the common electrode 810 as being disposed on the upper substrate 900, but the present disclosure is not limited thereto. That is, alternatively, the common electrode 810 may be disposed on the substrate 500. That is, the display device according to the present exemplary embodiment may also be applicable to an in-plane switching (IPS)- or plane-to-line switching (PLS)-mode LCD.

A manufacturing method of a display device, according to an exemplary embodiment, will hereinafter be described with reference to FIGS. 9 to 17. In FIGS. 1 to 17, like reference numerals reference numerals represent like elements, and thus, detailed descriptions thereof may be omitted.

FIGS. 9 through 17 are cross-sectional views illustrating a manufacturing method of a display device, according to an exemplary embodiment.

Referring to FIGS. 9 to 17, the manufacturing method includes: preparing a substrate on which a gate electrode, a semiconductor layer disposed on the gate electrode, a first barrier layer disposed on the semiconductor layer and containing Mo, a conductive layer disposed on the first barrier layer, and a second barrier layer disposed on the conductive layer are formed; forming a first photosensitive layer pattern having, on the conductive layer, a first area, in which the first photosensitive layer pattern has a first thickness, and a second area, in which the first photosensitive layer pattern has a second thickness that is larger than the first thickness, and forming a data line and a semiconductor pattern by etching the semiconductor layer, the first barrier layer, the conductive layer, and the second barrier layer using the photosensitive layer pattern as a mask; forming a second photosensitive layer pattern that exposes a part of the conductive layer, by removing the first area of the first photosensitive layer pattern, forming a source electrode, a drain electrode, and a channel portion that is disposed between the source and drain electrodes, by etching the second barrier layer and the conductive layer using the second photosensitive layer pattern as a mask, and removing the second photosensitive layer pattern; forming a molybdenum oxide layer on a segment of the first barrier layer corresponding to the channel portion and molybdenum oxide areas on outer sides of each of segments of the first barrier layer overlapped by the source electrode, the drain electrode, and the data line by oxidizing the substrate; and at least partially removing the molybdenum oxide layer by rinsing the substrate.

Figure 9:
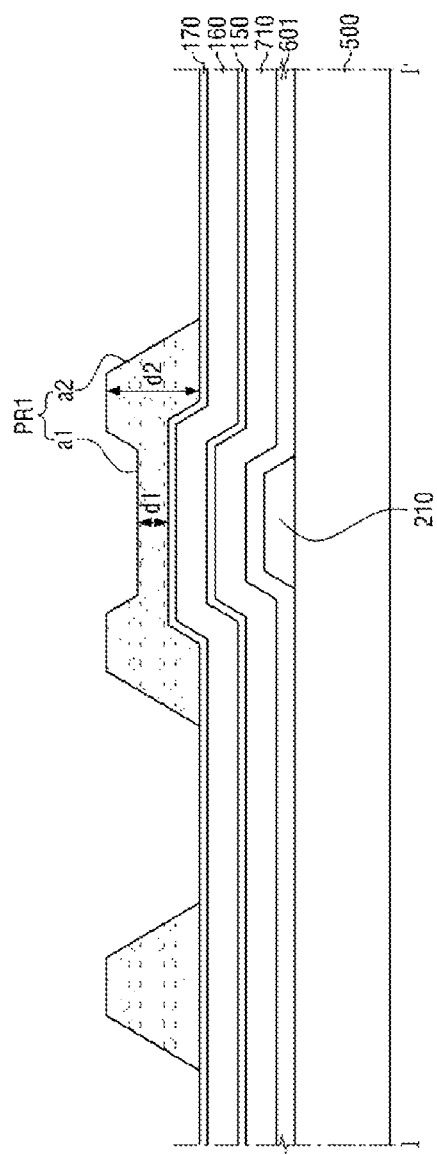
FIGS. 9 through 17 are cross-sectional views illustrating a manufacturing method of a display device, according to an exemplary embodiment.

Referring to FIG. 9, gate wiring including a gate electrode 210 is formed on a substrate 500. The gate wiring may be formed by forming a gate conductor layer on the substrate 500 and patterning the gate conductor layer. The gate conductor layer may be formed by depositing a metal material through a sputtering or chemical vapor deposition (CVD) process. The patterning of the gate conductor layer may be performed by photolithography.

Thereafter, a gate insulating layer 601, a semiconductor layer 710, a first barrier layer 150, a conductive layer 160, and a second barrier layer 170 are sequentially formed on the gate electrode 210.

The semiconductor layer 710 may be etched and may thus become a semiconductor pattern of a display device according to exemplary embodiments. The first and second barrier layers 150 and 170 may also be etched and may thus become first and second barrier layers, respectively, of the display device according to exemplary embodiments. The conductive layer 160 may also be etched and may thus form data wiring of the display device according to exemplary embodiments.

A first photosensitive layer pattern PR1 may be disposed on the conductive layer 160 of the substrate 500 on which the gate electrode 210, the gate insulating layer 601, the semiconductor layer 710, the first barrier layer 150, the conductive layer 160, and the second barrier layer 170 are sequentially disposed. The first photosensitive layer pattern PR1 may be formed by applying a photosensitive layer and subjecting the photosensitive layer to light exposure and development using a halftone mask (not illustrated) or a slit mask (not illustrated). The first photosensitive layer pattern PR1 may include a first area a1 where the first photosensitive layer pattern PR1 has a first thickness d1 and a second area a2 where the first photosensitive layer pattern PR1 has a second thickness d2 that is larger than the first thickness d1. For example, the first area a1 may be located in a region corresponding to the channel portion of a TFT, and the second area a2 may be located in a region where data wiring is to remain.

Figure 10:
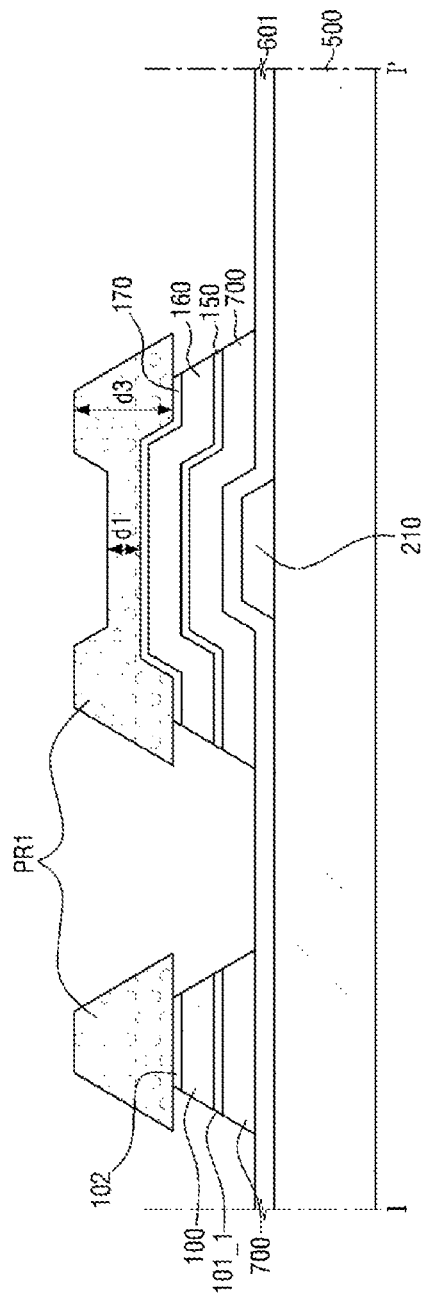

Thereafter, referring to FIG. 10, the semiconductor layer 710, the first barrier layer 150, the conductive layer 160, and the second barrier layer 170 are etched using the first photosensitive layer pattern PR1 as a mask. For example, wet etching may be used to etch the semiconductor layer 710, the first barrier layer 150, the conductive layer 160, and the second barrier layer 170, but the present disclosure is not limited thereto. That is, alternatively, dry etching may be used. Still alternatively, both wet etching and dry etching may be used. For example, the first barrier layer 150, the conductive layer 160, and the second barrier layer 170 may be wet-etched, and the semiconductor layer 710 may be dry-etched. However, the present disclosure is not limited to these examples.

As a result of the etching of the semiconductor layer 710, the first barrier layer 150, the conductive layer 160, and the second barrier layer 170, a pattern may be formed, and the gate insulating layer 601 may remain. Also, a semiconductor pattern 700 and a data line 100 overlapping the semiconductor pattern 700 may be formed.

Figure 11:
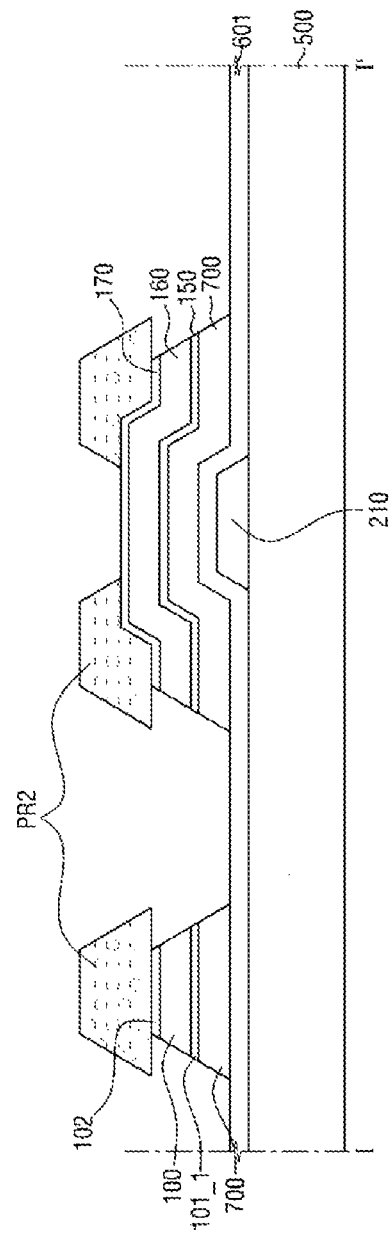
Figure 12:
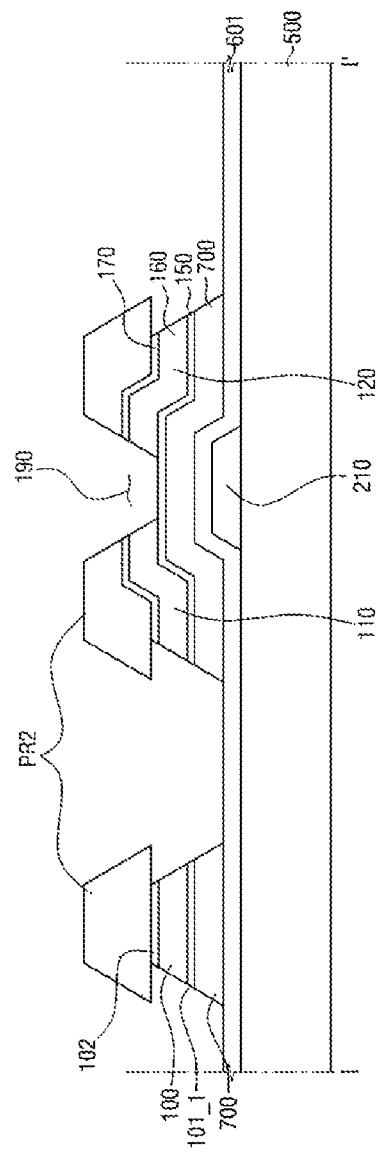
Figure 13:
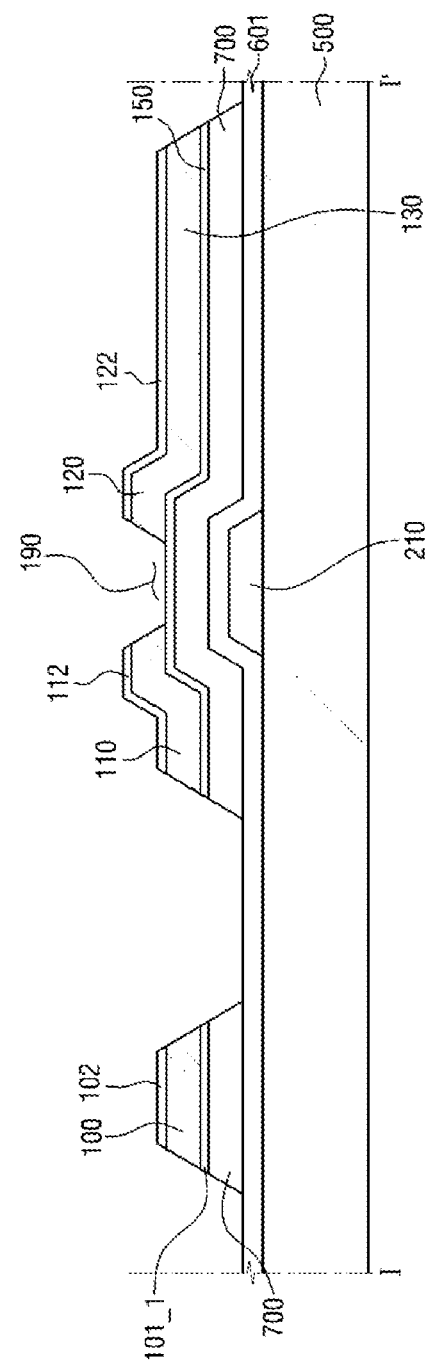

Thereafter, referring to FIG. 11, a second photosensitive layer pattern PR2 is formed by reducing the thickness of the first photosensitive layer pattern PR1 to remove the first area a1. As a result, the second barrier layer 170 may be exposed in the region corresponding to the channel portion of the TFT. The formation of the second photosensitive layer pattern PR2 by reducing the thickness of the first photosensitive layer pattern PR1 and removing the first area a1 of the first photosensitive layer pattern PR1 may be performed by an etch-back or ashing process, but the present disclosure is not limited thereto. Thereafter, referring to FIG. 12, the second barrier layer 170 and the conductive layer 160 are etched using the second photosensitive layer pattern PR2 as a mask. The etching of the second barrier layer 170 and the conductive layer 160 may be performed by wet etching, but the present disclosure is not limited thereto. During the etching of the second barrier layer 170 and the conductive layer 160, the first barrier layer 160 may remain unetched. As a result of the etching of the second barrier layer 170 and the conductive layer 160, source and drain electrodes 110 and 120 and a channel portion 190 are formed, and the source and drain electrodes 110 and 120 are spaced from each other with the channel portion 190 interposed therebetween. Thereafter, referring to FIG. 13, the second photosensitive layer pattern PR2 may be removed.

Figure 14:
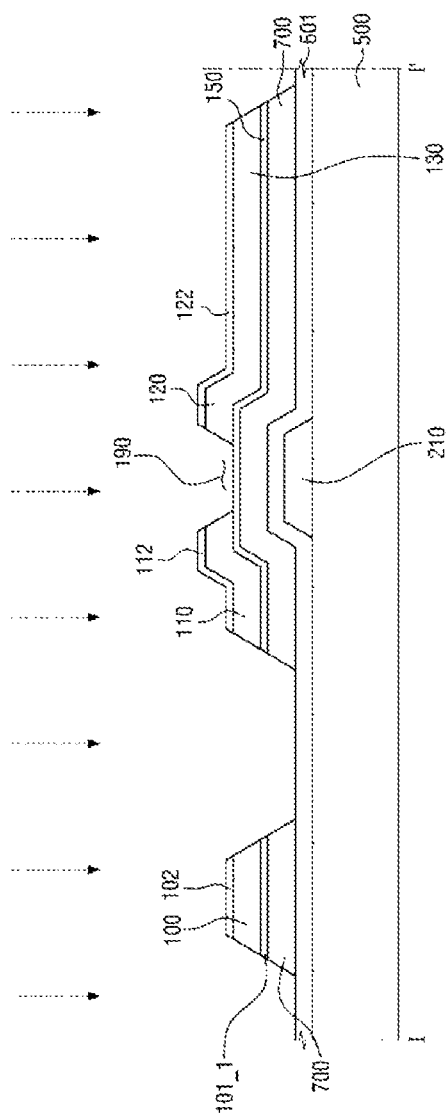

Thereafter, referring to FIG. 14, an oxidization process may be performed on the substrate 500 to remove the second photosensitive layer pattern PR2. The oxidization process may be performed using plasma. The oxidization process may be performed on the entire surface, or only a part of the surface, of the substrate 500.

Figure 15:
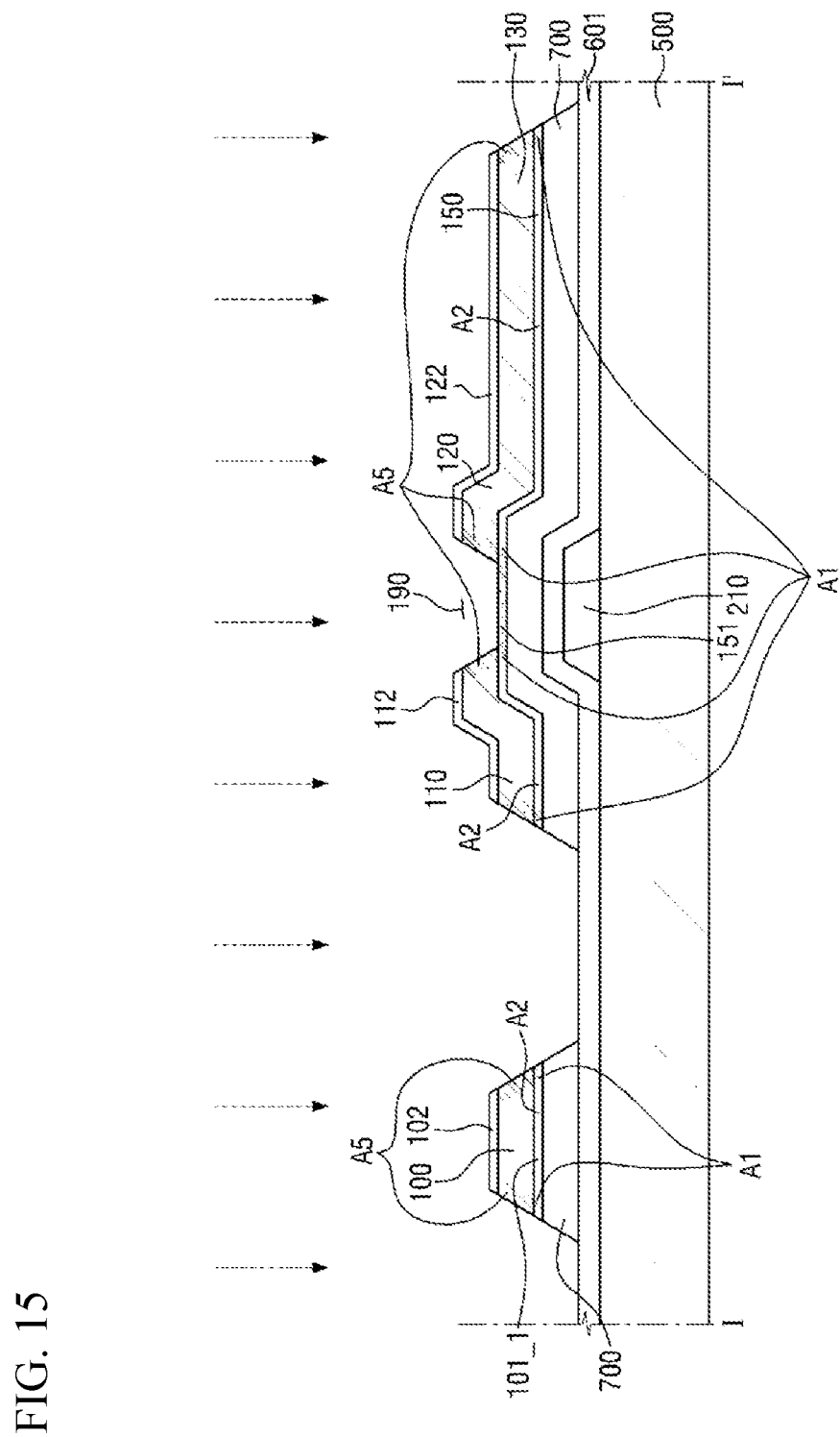

FIG. 15 illustrates a state of the substrate 500 after the oxidization process. After the entire surface of the substrate 500 is oxidized, as illustrated in FIG. 14, the substrate 500 may become as illustrated in FIG. 15. More specifically, molybdenum oxide areas Al may be provided on outer sides of each of first barrier layers 101_1, 111_1, and 121_1 below data wiring (100, 110, 120, and 130) (see FIG. 5 for details). Oxidized areas A5 may be formed on outer sides of the data wiring (100, 110, 120, and 130) (see FIG. 7A for details). Further, a molybdenum oxide layer 151 may be formed due to the first barrier layer 150 being oxidized in the channel portion 190.

Figure 16:
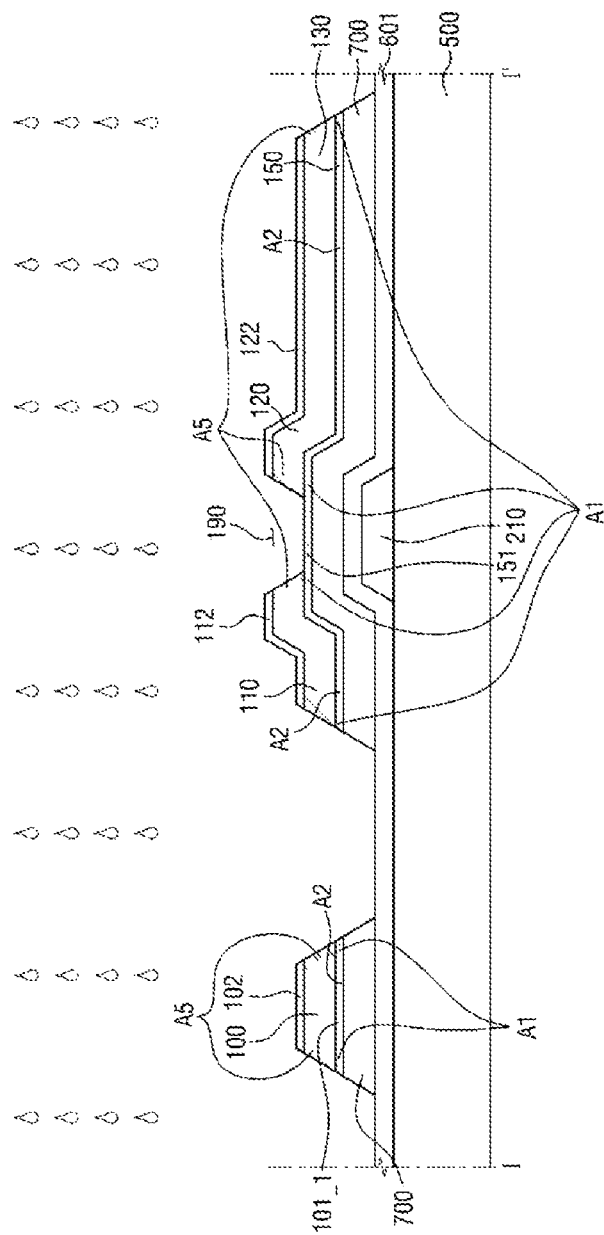

Thereafter, referring to FIG. 16, a rinsing process may be performed. For example, water may be used as a rinsing liquid. By using water in the rinsing process, at least a part of the molybdenum oxide layer 151 may be removed without causing damage to the other elements.

Figure 17:
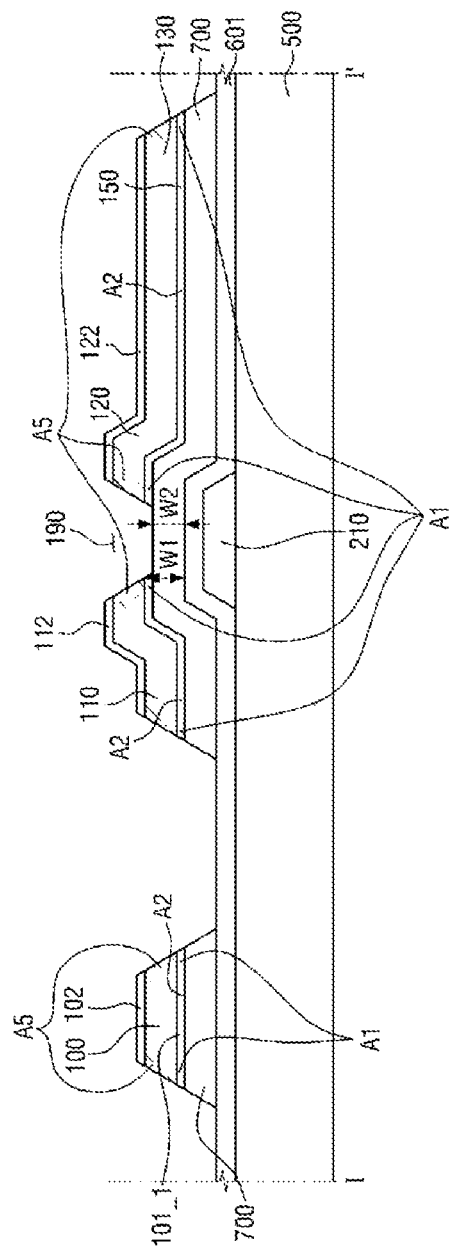

Referring to FIG. 17, at least a part of the molybdenum oxide layer 151 may be removed by the rinsing process. FIG. 17 illustrates the molybdenum oxide layer 151 as being completely removed, but the present disclosure is not limited thereto. That is, alternatively, at least a part of the molybdenum oxide layer 151 may still remain even after the rinsing process, in which case, the substrate 500 may have a structure as illustrated in FIG. 7B.

In the manufacturing method according to the present exemplary embodiment, one oxidization process and then one rinsing process are performed, but the present disclosure is not limited thereto. That is, more than one rinsing process may be performed repeatedly after an oxidization process, and may be continued until the molybdenum oxide layer 151 is completely removed.

In a case where the rinsing process is performed using a rinsing liquid such as water, outer sides of each of the first barrier layers 101_1, 111_1, and 121_1 below the data wiring (100, 110, 120, and 130) may be partially removed along with the molybdenum oxide layer 151. As a result, each of the first barrier layers 101_1, 111_1, and 121_1 may be inwardly recessed on parts of the sidewalls, thereby forming undercuts that are substantially as illustrated in FIG. 3 or FIG. 4.

After the substrate 500 is rinsed with a rinsing liquid, at least a part of the molybdenum oxide layer 151 may be removed without affecting the semiconductor pattern 700 below the molybdenum oxide layer 151. That is, according to the present exemplary embodiment, a thickness W1 of the semiconductor pattern 700 in an overlapping area with the source electrode 110 or the drain electrode 120 may be substantially the same as a thickness W2 of the semiconductor pattern 700 in the channel portion 190. In this case, the TFT may achieve excellent properties compared to a case in which the thicknesses W1 and W2 are different from each other. That is, the distribution of the TFT may be improved.

While the present disclosure has been particularly illustrated and described with reference to exemplary embodiments thereof, it will be understood by those of ordinary skill in the art that various changes in form and detail may be made without departing from the spirit and scope of the present disclosure. The exemplary embodiments should be considered in a descriptive sense only and not for purposes of limitation.

What is claimed is:

1. A display device, comprising:
   a substrate;
   a gate electrode disposed on the substrate;
   a semiconductor pattern disposed on the gate electrode;
   data wiring disposed on the semiconductor pattern and comprising a data line, a source electrode, and a drain electrode;
   a first barrier layer disposed between the data wiring and the semiconductor pattern; and
   undercuts disposed on at least one side of each segment of the first barrier layer.

2. The display device of claim 1, wherein the first barrier layer comprises molybdenum oxide areas that contain molybdenum oxide, and molybdenum (Mo) areas that contain Mo, but no molybdenum oxide.

3. The display device of claim 2, wherein the molybdenum oxide areas are provided on outer sides of each segment of the first barrier layer and the Mo areas are respectively provided inside the molybdenum oxide areas.

4. The display device of claim 2, wherein the undercuts are disposed in the molybdenum oxide areas.

5. The display device of claim 2, wherein sidewalls of each segment of the first barrier layer where the undercuts are formed are tapered or reversely tapered.

6. The display device of claim 2, wherein a concentration of molybdenum oxide in each of the molybdenum oxide areas gradually decreases from an outer side to an inner side of a corresponding molybdenum oxide area.

7. The display device of claim 2, wherein the semiconductor pattern contains Mo.

8. The display device of claim 2, wherein an area of the semiconductor pattern overlapped by the source electrode or the drain electrode is defined as an overlap area and the rest of the semiconductor pattern is defined as a non-overlap area, and wherein a concentration of Mo is higher in the overlap area than in the non-overlap area.

9. The display device of claim 8, wherein the concentration of Mo gradually decreases from a top portion to a bottom portion of the non-overlap area.

10. The display device of claim 1, further comprising:
    a second barrier layer disposed on the data wiring.

11. The display device of claim 10, wherein the second barrier layer contains a metal oxide.

12. The display device of claim 1, wherein the data wiring comprises oxide areas that are formed on outer sides of the data wiring.

13. A display device, comprising:
    a substrate;
    a gate electrode disposed on the substrate;
    a semiconductor pattern disposed on the gate electrode;
    data wiring formed on the semiconductor pattern and comprising a data line, a source electrode, and a drain electrode;
    a first barrier layer disposed between the data wiring and the semiconductor pattern; and
    a molybdenum oxide layer disposed on a part of the semiconductor pattern between the source and drain electrodes.

14. The display device of claim 13, wherein the molybdenum oxide layer covers at least a part of a top surface of the semiconductor pattern.

15. The display device of claim 13, wherein a channel portion is formed between the source and drain electrodes and the molybdenum oxide layer partially overlaps the channel portion.

16. The display device of claim 13, wherein the first barrier layer comprises molybdenum oxide areas that contain molybdenum oxide, and Mo areas that contain Mo, but no molybdenum oxide.

17. The display device of claim 16, wherein the molybdenum oxide areas are provided on outer sides of each segment of the first barrier layer and the Mo areas are respectively provided inside the molybdenum oxide areas.

18. The display device of claim 13, wherein a concentration of molybdenum oxide in each of the molybdenum oxide areas gradually decreases from an outer side to an inner side of a corresponding molybdenum oxide area.

19. The display device of claim 13, wherein the semiconductor pattern contains Mo.

* * * * *